US006482688B2

(12) United States Patent
Hu et al.

(10) Patent No.: US 6,482,688 B2
(45) Date of Patent: Nov. 19, 2002

(54) UTILIZING AMORPHORIZATION OF POLYCRYSTALLINE STRUCTURES TO ACHIEVE T-SHAPED MOSFET GATE

(75) Inventors: Chimin Hu, Pearland, TX (US); Amitabh Jain, Richardson, TX (US); Reima Tapani Laaksonen, Dallas, TX (US); Manoj Mehrotra, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/822,998

(22) Filed: Mar. 30, 2001

(65) Prior Publication Data

US 2002/0142530 A1 Oct. 3, 2002

(51) Int. Cl.[7] .............................................. H01L 21/338
(52) U.S. Cl. ........................ 438/182; 438/705; 438/739
(58) Field of Search ................................ 438/182, 705, 438/739, 924

(56) References Cited

U.S. PATENT DOCUMENTS

| | | | | |
|---|---|---|---|---|
| 4,450,041 A | * | 5/1984 | Aklufi | 438/705 |
| 4,925,805 A | * | 5/1990 | van Ommen et al. | 257/347 |
| 4,997,778 A | | 3/1991 | Sim et al. | |
| 5,001,079 A | * | 3/1991 | van Laarhoven et al. | 257/774 |
| 5,153,813 A | * | 10/1992 | Oehrlein et al. | 257/309 |
| 5,470,767 A | | 11/1995 | Nakamoto et al. | |
| 5,559,049 A | * | 9/1996 | Cho | 438/283 |
| 5,622,882 A | * | 4/1997 | Yee | 438/210 |
| 5,639,689 A | * | 6/1997 | Woo | 438/398 |
| 5,641,380 A | * | 6/1997 | Yamazaki et al. | 438/164 |
| 5,741,736 A | * | 4/1998 | Orlowski et al. | 438/286 |
| 5,856,217 A | | 1/1999 | Nguyen et al. | |
| 6,051,454 A | | 4/2000 | Anda et al. | |
| 6,309,975 B1 | * | 10/2001 | Wu et al. | 438/705 |

OTHER PUBLICATIONS

"Intel Makes Transistors A Notch Faster", Design News Semiconductor Manufacturing, John H. Day, Contributing Editor, Jun. 5, 2000, p. S–13.

"Wafer Processing", Technology News Semiconductor International, Peter Singer, Editor–In–Chief, Nov., 1999, p. 44.

* cited by examiner

Primary Examiner—Richard Elms
Assistant Examiner—Christian D. Wilson
(74) Attorney, Agent, or Firm—Jacqueline J. Garner; W. James Brady, III; Frederick J. Telecky, Jr.

(57) ABSTRACT

A method of forming a generally T-shaped structure. The method comprises forming a poly/amorphous silicon layer stack which comprises a polysilicon layer and a generally amorphous silicon layer overlying the polysilicon layer. The method further comprises selectively etching the poly/amorphous silicon layer stack, wherein an etch rate associated with the generally amorphous silicon layer in an over etch step associated therewith is less than an etch rate associated with the polysilicon layer, thereby causing a lateral portion of the generally amorphous silicon layer to extend beyond a corresponding lateral portion of the polysilicon layer.

28 Claims, 8 Drawing Sheets

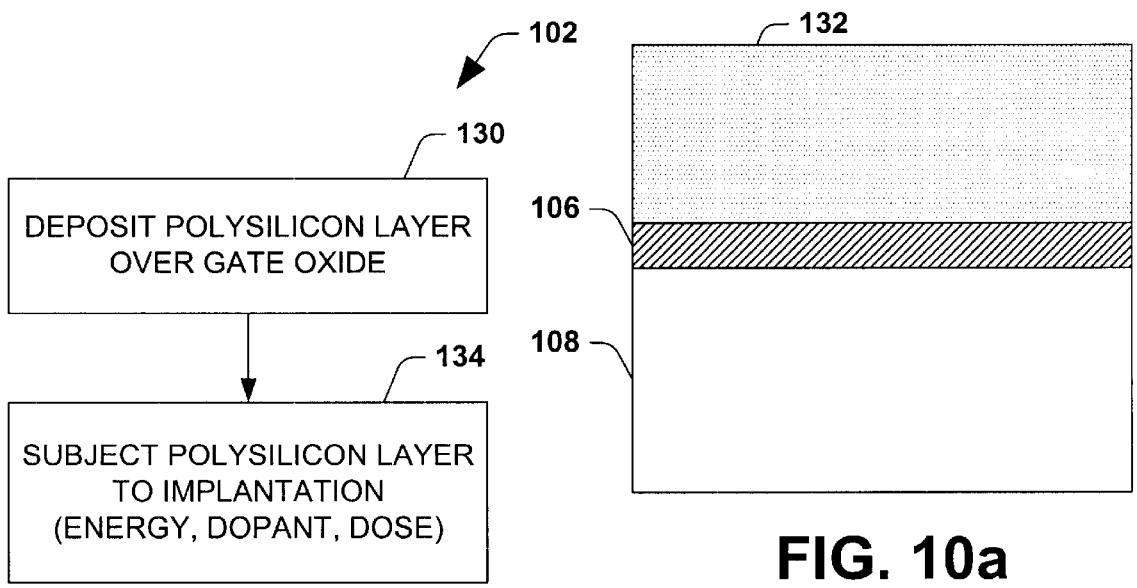
FIG. 9
FIG. 10a
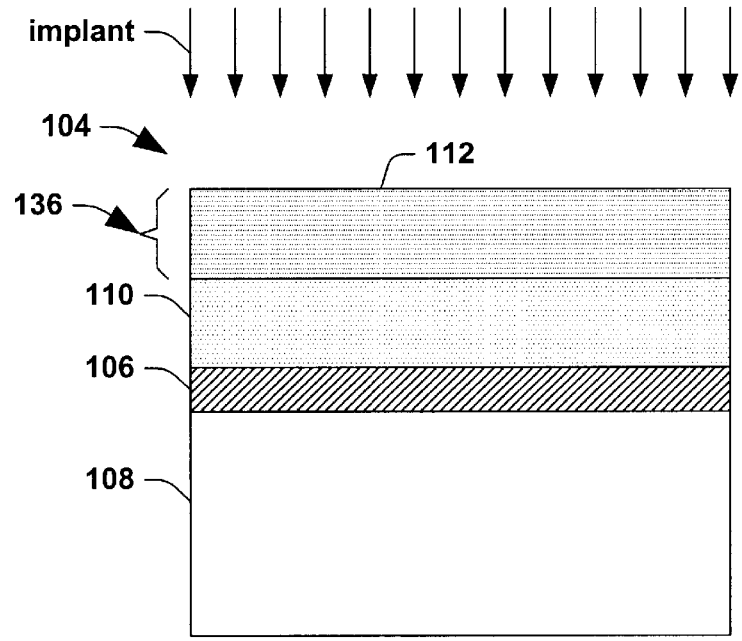
FIG. 10b

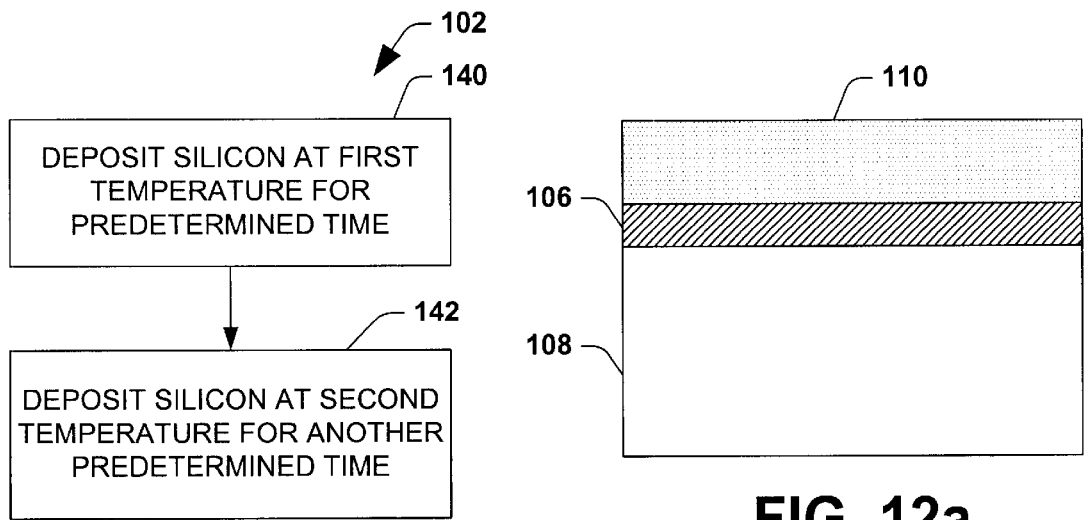
FIG. 11
FIG. 12a
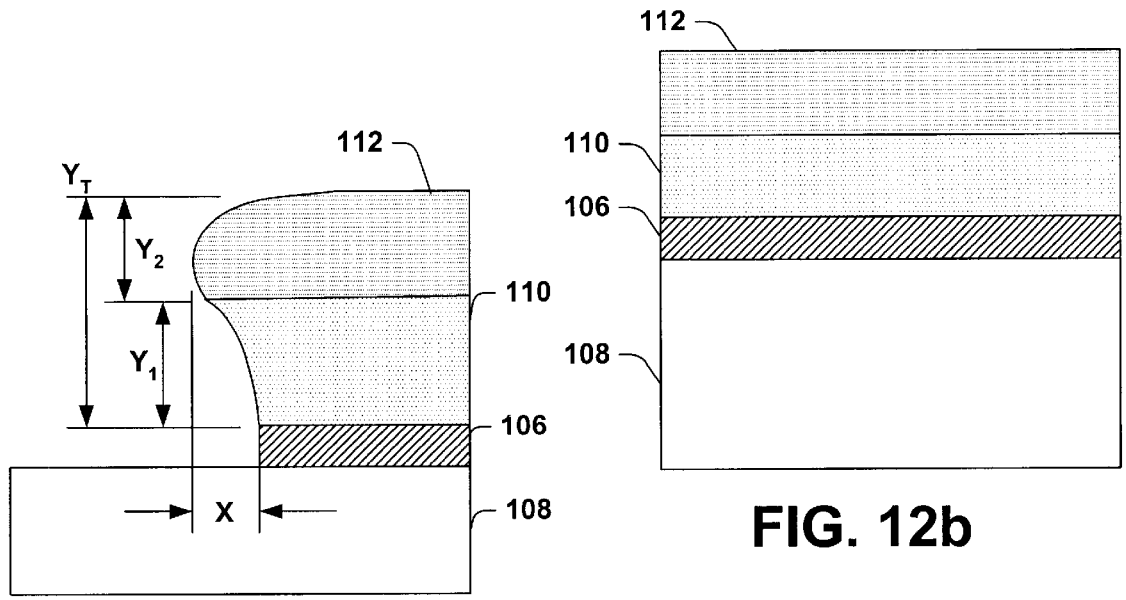
FIG. 13
FIG. 12b

UTILIZING AMORPHORIZATION OF POLYCRYSTALLINE STRUCTURES TO ACHIEVE T-SHAPED MOSFET GATE

FIELD OF THE INVENTION

The present invention relates generally to the field of ingrated circuits, and more particularly to a method of fabricating a transistor device having a generally T-shaped gate.

BACKGROUND OF THE INVENTION

MOS type transistors are a fundamental building block within integrated circuits. Consequently, there is a persistent push to make such devices smaller, faster, etc. The switching speed of a transistor is an important characteristic since it dictates, at least in one respect, how fast the circuits which employ such devices operate. Presently, the switching speed of a transistor is not always limited by the channel transit time (i.e., the time required for charge to be transported across the channel); instead, the switching speed sometimes is limited by the time required to charge and discharge the capacitances that exist between the device electrodes and between the interconnecting conductive lines and the substrate.

One way of appreciating the transistor capacitances is through an exemplary cross section, as illustrated in prior art FIG. 1. The transistor, an NMOS transistor designated at reference numeral 10, includes a p-type region 12 (sometimes referred to as the body), such as a P-well or substrate in a CMOS type process. The body 12 has an n-type drain region 14 and a source region 18 formed therein. A doped polysilicon gate 22 overlies a thin gate oxide 24 which defines a channel region 26 therebeneath in the body 12.

An effective circuit diagram illustrating the various capacitances associated with the transistor 10 is illustrated in prior art FIG. 2 and designated at reference numeral 30. As seen in prior art FIG. 2, capacitances exist between the various device electrodes and between the electrodes and the body region. The drain-to-body capacitance ($C_{db}$) and the source-to-body capacitance ($C_{sb}$) are illustrated in prior art FIG. 2 and are referred to often as junction capacitances. The value of the junction capacitances are a function of both the cross sectional area of the junctions as well as the doping concentrations of the regions, respectively. Similarly, the gate-to-drain capacitance ($C_{gd}$) and the gate-to-source capacitance ($C_{gs}$) illustrated in FIG. 2 are often collectively referred to as a gate overlap capacitance. The value of such capacitances are a function of the gate oxide thickness and the degree of overlap between the gate and source/drain regions, respectively.

Several developments have occurred which are directed to the reduction in the gate-to-drain ($C_{gd}$) and the gate-to-source ($C_{gs}$) capacitances in order to increase device speed. For example, as illustrated in prior art FIG. 3a, after the gate region 22 is defined, an implantation step occurs, by which dopants 40 are implanted into the substrate 12. Since the implantation of dopants (e.g., n-type dopants for an NMOS transistor) cause lattice damage, a subsequent thermal processing step (sometimes referred to as an anneal) is conducted. The thermal processing causes the dopants 40 to diffuse and the lattice to be repaired, thereby causing the drain and source regions 14 and 18, respectively, to extend substantially under lateral portions 42 of the gate electrode 22, as illustrated in prior art FIG. 3b. The extent or distance (e.g., $D_{gd}$ illustrated in prior art FIG. 3c) in which the source and drain regions diffuse under the gate contributes to $C_{gd}$ and $C_{gs}$, respectively.

As is known, for a parallel plate type capacitor configuration (which the gate-to-source and gate-to-drain capacitances approximate), the capacitance C is a function of the dielectric (∈), the cross sectional area (A) of the parallel plates, and the distance (d) between the plates; C=∈A/d. Therefore, as can be seen in prior art FIG. 3c, an excessive overlap of the gate and the drain/source ($D_{gd}$) negatively contributes to an increase in $C_{gd}$ and $C_{gs}$.

One way in which designers have attempted to decrease $C_{gd}$ and $C_{gs}$ is to form a poly oxide layer over the gate poly, as illustrated in prior art FIG. 4a and designated at reference numeral 50. That is, after the poly gate 22 has been defined, an oxide 52 is grown around the poly, thereby forming an oxide sidewall 54 on the lateral edges of the poly, having a particular thickness (t). Using the poly oxide 52, a subsequent implantation of dopants 40 is spaced laterally away from the gate by a distance (t') which approximates the poly oxide thickness (t). Consequently, any subsequent anneal results in a lesser amount of source/drain under the gate electrode and thus less gate overlap capacitance. Unfortunately, forming poly oxides 52 having thicknesses greater than about 50 Angstroms results in more silicon being consumed which leads to a silicon recess and increased series resistance, which disadvantageously lowers drive current. In addition, as illustrated in prior art FIG. 4b, the implantation dopants 58 are attracted to the poly oxide sidewall 54, resulting in a poorly controlled dopant loss in the substrate (sometimes referred to as segregation). Due to the segregation and the poor flexibility in fashioning the poly oxide thickness, the poly oxide solution has not served reliably to satisfactorily reduce $C_{gd}$ and $C_{gs}$, respectively.

Another solution employed to reduce the $C_{gd}$ and $C_{gd}$ of transistors is to alter the shape of the gate electrode, for example, by generating a T-shaped gate electrode structure, as illustrated in prior art FIG. 5a and designated at reference numeral 60. As illustrated in FIG. 5a, the T-shaped gate electrode 60 has a top region 62 which is larger than a bottom region 64 which interfaces with the gate oxide 24. Consequently, a "gate footprint" 66 which shields the underlying substrate during a self-aligned source/drain implantation is dictated by the larger, top region 62 of the gate electrode 60. As illustrated in prior art FIG. 5a, this spatial relationship causes the implantation dopants 40 to be spaced further away from the smaller, bottom gate portion 64. Consequently, during subsequent thermal processing, the lateral diffusion of the drain and source regions 14 and 18 results in a lesser amount of overlap 68 ($D_{gd}$) with respect to the gate electrode, as illustrated in prior art FIGS. 5b–5c, respectively. With a reduction in the overlap ($D_{gd}$ or $D_{gs}$) between the gate and the source, and the gate and the drain, respectively, the cross sectional area (A) associated with the parallel plate capacitor model is reduced substantially.

Although the T-shaped gate electrode configuration of FIGS. 5a–5c provides for a favorable reduction in $C_{gd}$ and $C_{gs}$, fabricating devices using such a T-shaped gate electrode has proved challenging. For example, one prior art method of fabricating a T-shaped gate electrode employs a multi-step etch process, for example, as illustrated in prior art FIGS. 6a–6b, and designated at reference numeral 70. Looking to FIG. 6a, a polysilicon layer 72 is etched using a first etch chemistry to generate a generally anisotropic etch profile 74 for a predetermined period of time. Subsequently, as illustrated in prior art FIG. 6b, a second etch chemistry is employed which is generally isotropic, thereby causing an "undercut" in a bottom portion 76 of the polysilicon 72 which causes the feature of interest to have a notch 78 which approximates a T-shape feature when performed symmetrically.

The prior art etch solutions are not desirable because they tacitly utilize the polymer formation on the sides of the gate. The polymer is formed from the deposition of etch products and resist, and the polymer is thicker on the top of the gate than on the bottom thereof. The prior art methods exploit the etch rate difference between the polymer and the polysilicon. However, the process control of the notch depth and height is difficult. Such difficulty is caused by the various etch steps having different polymer formation rates, the polymer type perhaps being different in different steps, and the polymer etch rate not being well known.

Since a T-shaped gate electrode structure provides substantial advantages in reducing the $C_{gd}$ and $C_{gs}$ of transistor structures and thus advantageously improves transistor speed, there is a need for a method of forming the T-shaped gate electrode structure in an easy and controllable manner.

SUMMARY OF THE INVENTION

The present invention relates generally to a method of forming a generally T-shaped silicon structure, for example, for use as a gate electrode to thereby reduce a transistor capacitance associated therewith.

The present invention relates to a method of forming a generally T-shaped silicon structure. The invention comprises using a layered stack of differing silicon materials and exploiting a variation in the etch characteristics associated therewith to generate the generally T-shaped structure in a controllable fashion. Use of such a structure in a semiconductor manufacturing process allows for the formation of T-shaped silicon structures as gate electrodes.

According to one aspect of the present invention, a method of forming a generally T-shaped silicon structure comprises forming a poly/amorphous silicon layer stack, wherein a polysilicon layer underlies a generally amorphous silicon layer. The method further comprises etching the poly/amorphous silicon layer stack in multiple steps, for example, the BARC (bottom anti-reflective coating) step, the breakthrough (BT) etch step, the main etch (ME) step, the endpoint (EP) etch step, and the over etch (OE) step. The OE step may be the last step in the multi-step process, and is generally used when most of the polysilicon has already been removed from the wafer. The OE is used primarily to ensure that no polysilicon remains on the wafer except under mask covered areas. Some of these etch steps may have identical or very similar process conditions.

Since the generally amorphous silicon layer on top of the stack etches at a slower rate than the underlying polysilicon layer during the over etch step, an amount of lateral etching in the generally amorphous silicon layer is less than the underlying polysilicon. Consequently, a lateral portion of the generally amorphous silicon layer extends beyond a corresponding lateral portion of the underlying polysilicon layer, thereby resulting in a generally T-shaped silicon structure.

According to another aspect of the present invention, the formation of a poly/amorphous silicon layer stack comprises depositing via chemical vapor deposition (CVD) a silicon material in a CVD chamber at a first temperature (e.g., about 595° C. or more) to form a polysilicon layer. The method further comprises altering a chamber temperature and depositing via CVD a silicon material in the CVD chamber at a second temperature (e.g., less than about 595° C.) to form a generally amorphous silicon layer over the polysilicon layer.

In the above manner, the poly/amorphous silicon layer stack is formed in a single processing chamber, thereby allowing the layer stack to be formed with minimal contamination. In addition, by varying a temperature associated with the deposition of the generally amorphous silicon layer, an amount of amorphorization may be controlled, thereby resulting in controllable variations in the etch rate thereof, as may be desired. Further still, by varying a time by which the polysilicon layer and the generally amorphous silicon layer are deposited, the thicknesses may be varied and such thickness variations may be employed to vary an aspect ratio associated with the resulting generally T-shaped structure.

According to still another aspect of the present invention, the poly/amorphous silicon layer stack is formed by forming a polysilicon layer and subsequently implanting a top portion thereof. The implantation of the top portion of the polysilicon layer causes an amorphorization of the top portion. By controlling an energy, dopant and or dose of the implantation, a thickness of the amorphous top portion may be controlled, as well as an amount of amorphorization and etch rate difference between the amorphous layer and the polysilicon layers, as may be desired.

According to yet another aspect of the present invention, a method of forming a transistor having a generally T-shaped gate electrode is disclosed. The method comprises forming a poly/amorphous silicon layer stack and etching the stack to form a generally T-shaped gate electrode. The gate electrode is subsequently utilized to self-align the source/drain regions in a subsequent implantation step. The T-shaped gate electrode causes the source/drain dopants to be spaced away from the bottom, polysilicon portion of the gate electrode such that lateral diffusion due to a subsequent anneal reduces an overlap between the gate and source, and the gate and drain, respectively. The overlap reduction reduces the gate-to-source and the gate-to-drain capacitance of the transistor, thereby resulting in an improvement in transistor speed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 9 is a flow chart diagram illustrating a method of forming a poly/amorphous silicon layer stack according to one exemplary aspect of the present invention;

FIG. 10a is a fragmentary cross section diagram illustrating a polysilicon layer formed over a semiconductor substrate according to the present invention;

FIG. 10b is a fragmentary cross section diagram illustrating an implantation of a top portion of the polysilicon layer, resulting in an amorphorization of a top portion thereof according to the present invention;

FIG. 11 is a flow chart diagram illustrating a method of forming a poly/amorphous silicon layer stack according to another exemplary aspect of the present invention;

FIG. 12a is a fragmentary cross section diagram illustrating a polysilicon layer formed over a semiconductor substrate via a deposition process operating at a first deposition temperature according to the present invention;

FIG. 12b is a fragmentary cross section diagram illustrating a generally amorphous layer formed over a polysilicon layer via a deposition process operating at a second deposition temperature according to the present invention; and FIG. 13 is a fragmentary cross section diagram illustrating an exemplary generally T-shaped silicon structure according to one exemplary aspect of the present invention.

DETAILED DESCRIPTION OF THE INVENTION

The present invention will now be described with respect to the accompanying drawings in which like numbered elements represent like parts. The present invention is directed to a method of forming a generally T-shaped silicon structure, for example, for use as a gate electrode in a transistor device. The method comprises forming a poly/amorphous silicon layer stack, wherein a generally amorphous silicon layer is formed over a polysilicon layer. Since during an over etch step the etch rate of the generally amorphous silicon layer is less than an etch rate of the underlying polysilicon layer, a generally T-shaped silicon structure is formed. By varying the relative thicknesses of the two layers and/or the level of amorphorization of the generally amorphous silicon layer, an aspect ratio of the generally T-shaped silicon structure may be controlled, as may be desired.

Figure 1:
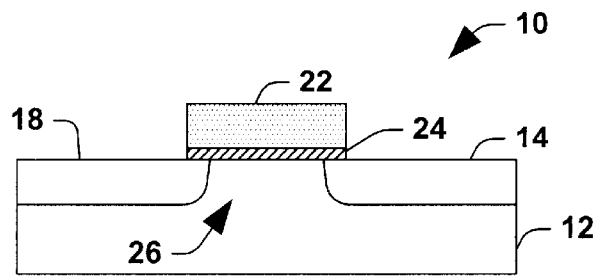
FIG. 1 is a fragmentary cross section diagram illustrating a prior art NMOS transistor.
Figure 2:
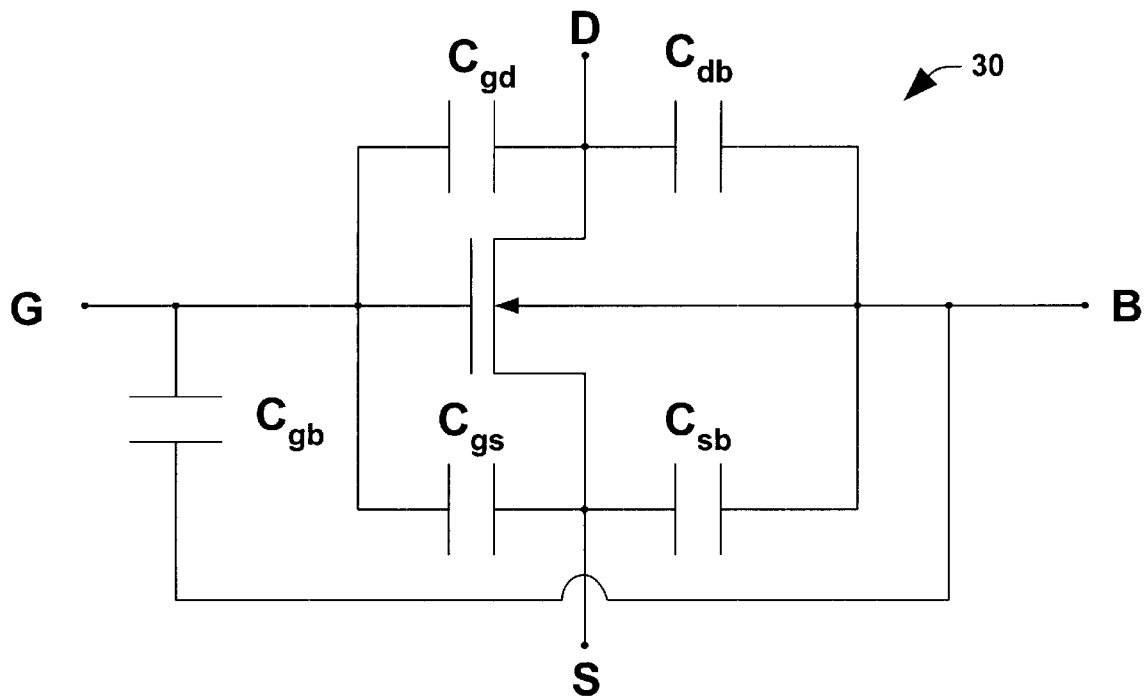
FIG. 2 is a schematic diagram illustrating a conventional NMOS transistor having various capacitances associated therewith modeled thereon.
Figure 3A:
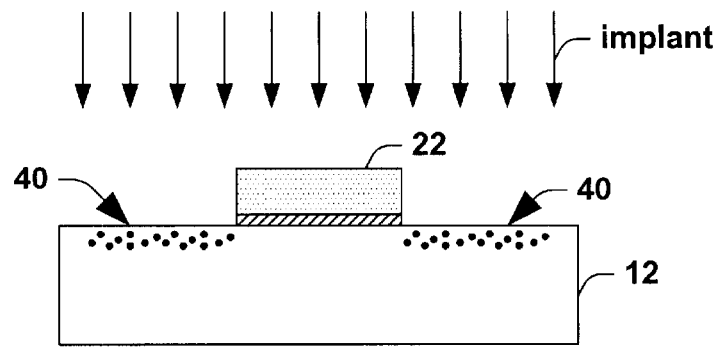
FIG. 3a is a prior art fragmentary cross section diagram illustrating an implantation of source/drain regions using a gate electrode to self-align the source/drains.
Figure 3B:
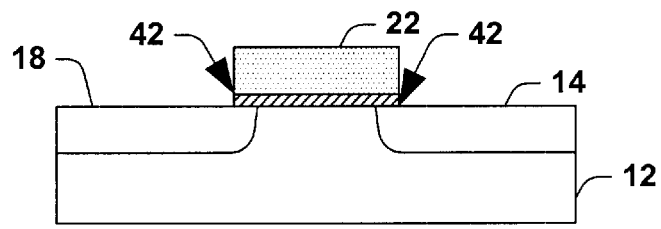
FIG. 3b is a fragmentary cross section diagram illustrating a prior art NMOS transistor and the gate-to-source and gate-to-drain overlap associated therewith due to an anneal subsequent source/drain implantation.
Figure 3C:
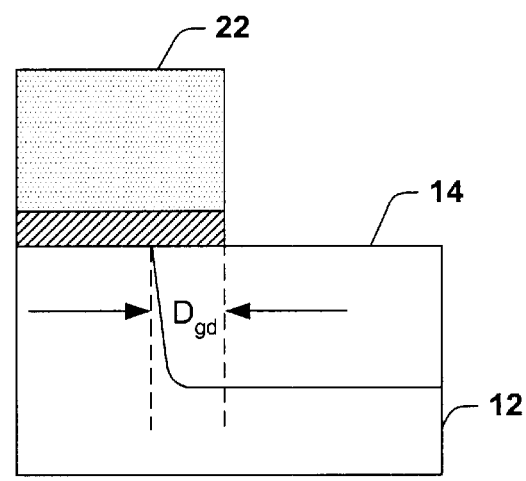
FIG. 3c is a fragmentary cross section diagram illustrating an enlarged portion of the transistor of FIG. 3b, wherein a gate-to-drain overlap ($D_{gd}$) characteristic is highlighted therein.
Figure 4A:
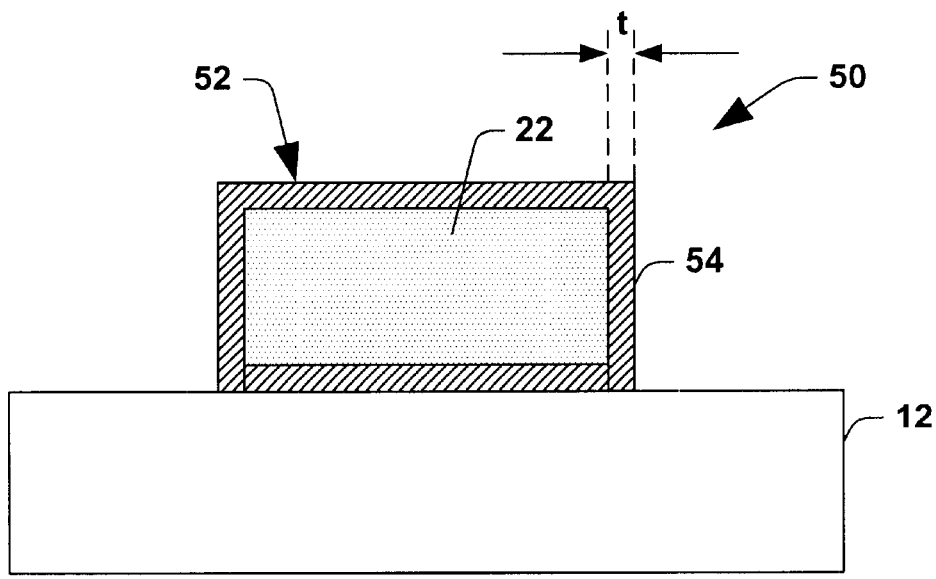
FIG. 4a is a fragmentary cross section diagram illustrating a prior art poly oxide process, wherein an oxide surrounds a polysilicon gate electrode.
Figure 4B:
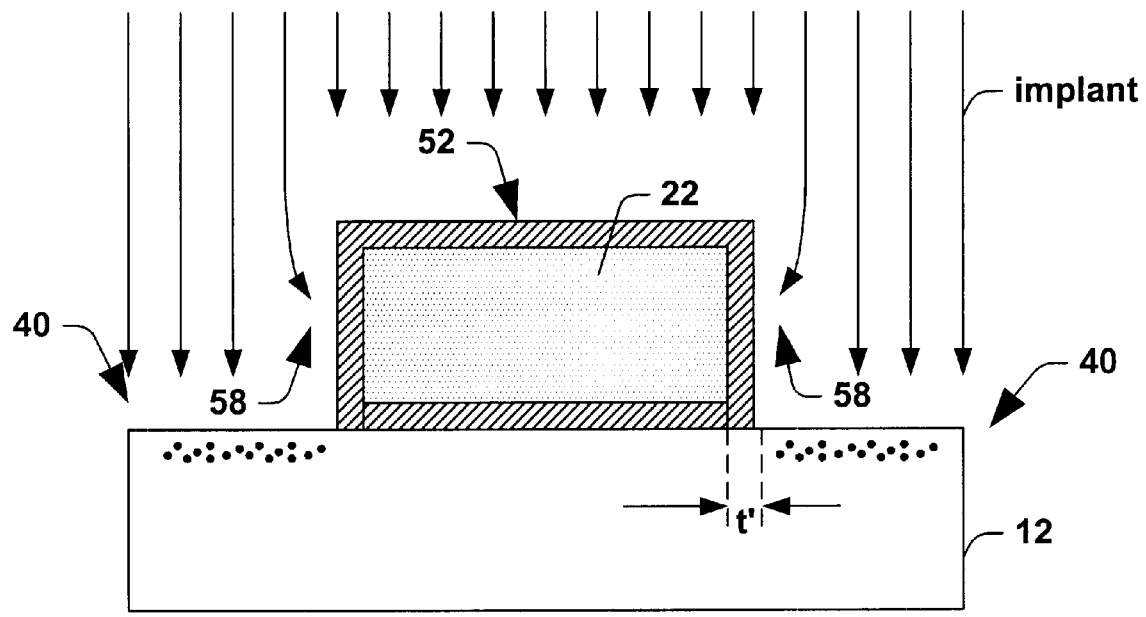
FIG. 4b is a prior art fragmentary cross section diagram illustrating dopant segregation due to the poly oxide on the gate electrode.
Figure 5A:
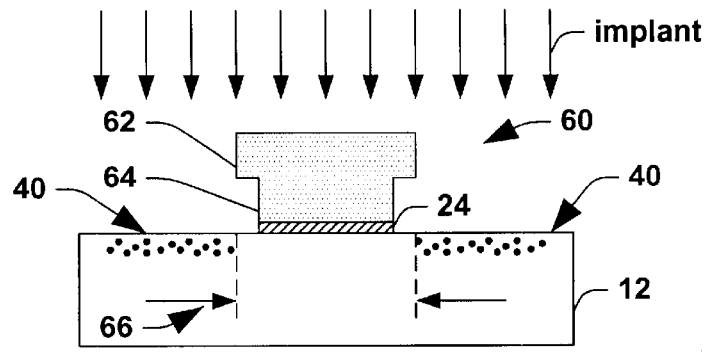
FIG. 5a is a fragmentary cross section diagram illustrating a generally T-shaped gate electrode and an impact the gate electrode has on dopant location for formation of source/drain regions.
Figure 5B:
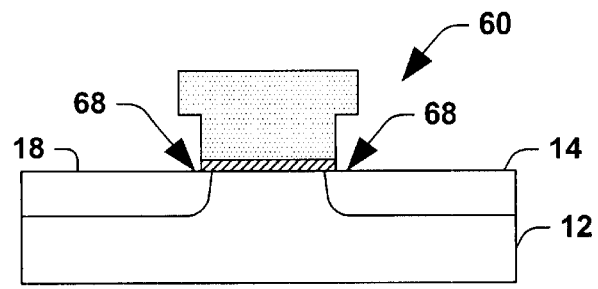
FIG. 5b is a fragmentary cross section diagram illustrating a transistor having the generally T-shaped gate electrode after an anneal, and how the generally T-shaped gate electrode reduces an overlap capacitance associated with the transistor device.
Figure 5C:
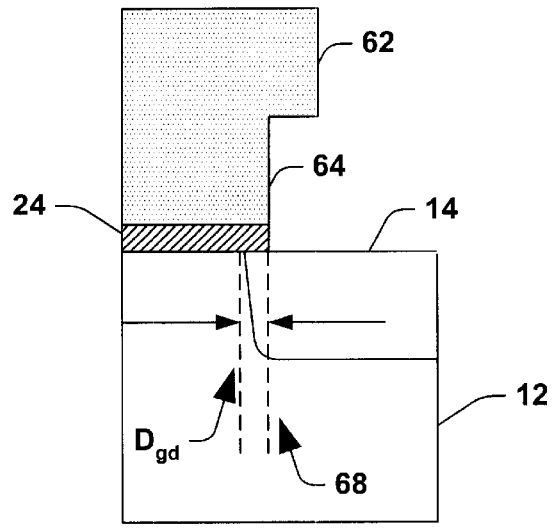
FIG. 5c is a fragmentary cross section diagram illustrating an enlarged portion of FIG. 5b, wherein a gate-to-drain overlap distance ($D_{gd}$) is reduced due to the generally T-shaped electrode structure.
Figure 6A:
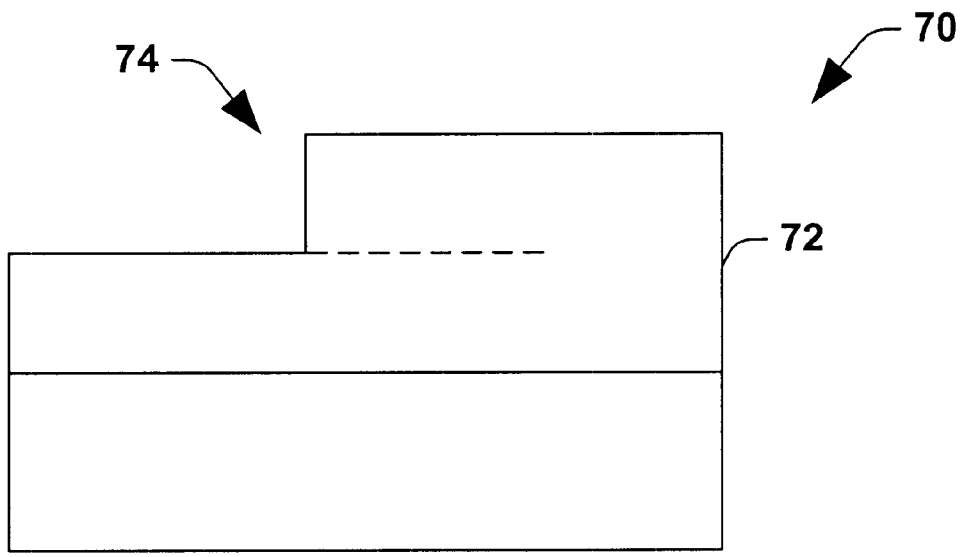
FIG. 6a is a fragmentary cross section diagram illustrating a first step in a prior art multi-step etch process used for forming a generally T-shaped gate electrode structure.
Figure 6B:
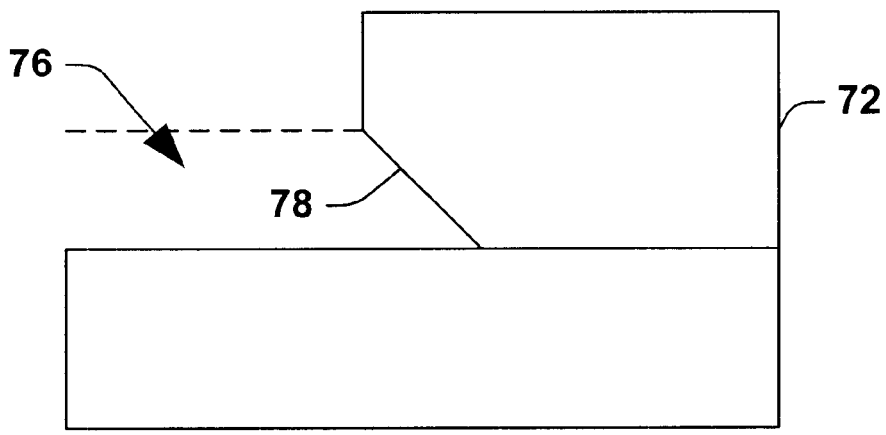
FIG. 6b is a fragmentary cross section diagram illustrating a second step in a prior art multi-step etch process used for forming the generally T-shaped gate electrode structure.
Figure 8A:
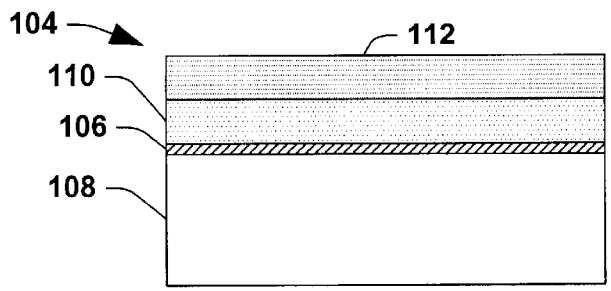
FIG. 8a is a fragmentary cross section diagram illustrating a poly/amorphous silicon layer stack overlying a semiconductor substrate according to the present invention.
Figure 7:
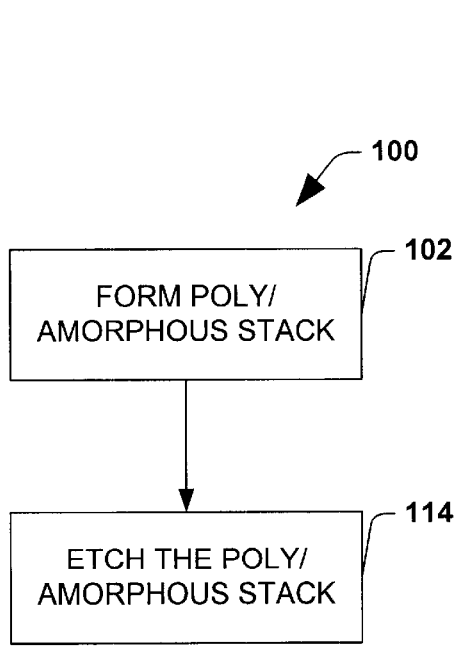
FIG. 7 is a flow chart diagram illustrating a method of forming a generally T-shaped silicon structure according to the present invention.

Turning now to the figures, FIG. 7 is a flow chart diagram illustrating a method of forming a generally T-shaped silicon structure according to one exemplary aspect of the present invention, and is designated at reference numeral 100. The method 100 comprises forming a poly/amorphous silicon layer stack at step 102. One exemplary type of poly/amorphous silicon layer stack is illustrated in FIG. 8a, and designated at reference numeral 104. In FIG. 8a, the stack 104 is formed over a gate oxide 106 which resides on a semiconductor substrate 108, however, the stack 104 may be formed on other substrates or underlying materials as may be desired, and such alternatives are contemplated as falling within the scope of the present invention. As illustrated in FIG. 8a, the poly/amorphous silicon layer stack 104 comprises a polysilicon layer 110 underlying a generally amorphous silicon layer 112.

Figure 8B:
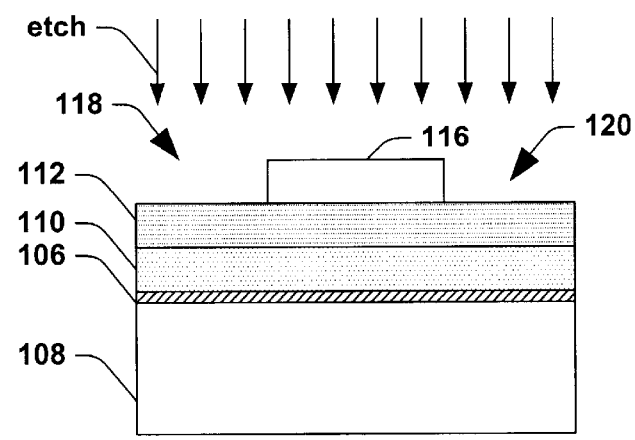
FIG. 8b is a fragmentary cross section diagram illustrating a selective etching of the poly/amorphous silicon layer stack according to the present invention.

Returning to FIG. 7, the method 100 continues at step 114, wherein the poly/amorphous silicon layer stack 104 is etched to form a generally T-shaped silicon structure. For example, as illustrated in FIG. 8b, the etching of step 114 may be accomplished selectively using an etched potoresist 116 to define etch regions 118 and 120, respectively. The etch, according to one exemplary aspect of the present invention, is a multi-step dry plasma etch which etches the top level, generally amorphous silicon layer 112 at a first rate due to its material properties. The etch step 114 continues to etch the underlying polysilicon layer 110 at a second rate due to its material properties.

According to one exemplary aspect of the present invention, the BARC step may comprise an etch time by endpoint+about 50% over etch with a pressure of about 8 mtorr, a bias power of about 100 W, a source power of about 310 W, an HBr flow of about 87 sccm and an $O_2$ flow of about 32 sccm. The BT step may comprise an etch time of about 15 seconds at a pressure of about 4 mtorr, a bias power of about 40 W, a source power of about 500 W, and a $CF_4$ flow of about 50 sccm. The ME step may comprise an etch time of about 28 seconds, a pressure of about 4 mtorr, a bias power of about 80 W, a source power of about 475 W, an HBr flow of about 90 sccm, a $Cl_2$ flow of about 55 sccm, a $CF_4$ flow of about 20 sccm, and an He:$O_2$ flow of about 15 sccm. The EP step may comprise an etch time by endpoint at a pressure of about 13 mtorr, a bias power of about 55 W, a source power of about 335 W, an HBr flow of about 161 sccm, a $Cl_2$ flow of about 76 sccm, and an He:$O_2$ flow of about 18 sccm. Lastly, an OE step may comprise an etch time of about 60 seconds at a pressure of about 100 mtorr, a bias power of about 150 W, a source power of about 1000

W, an HBr flow of about 160 sccm, and an He:O$_2$ flow of about 10 sccm.

Figure 8D:
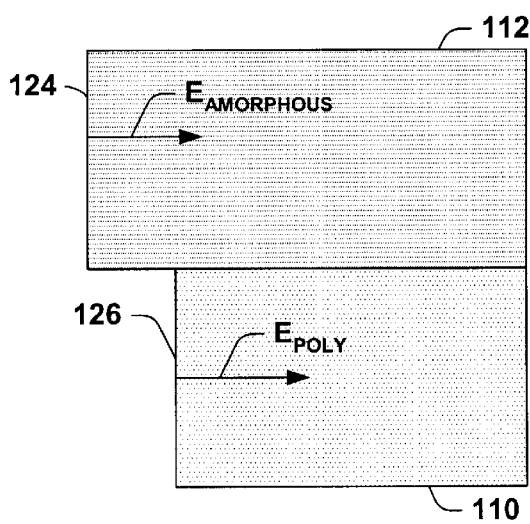
FIG. 8d is a fragmentary cross section diagram illustrating in greater detail how a differing etch characteristic associated with the polysilicon layer and the generally amorphous silicon layer in the poly/amorphous silicon layer stack results in a generally T-shaped silicon structure according to the present invention.
Figure 8C:
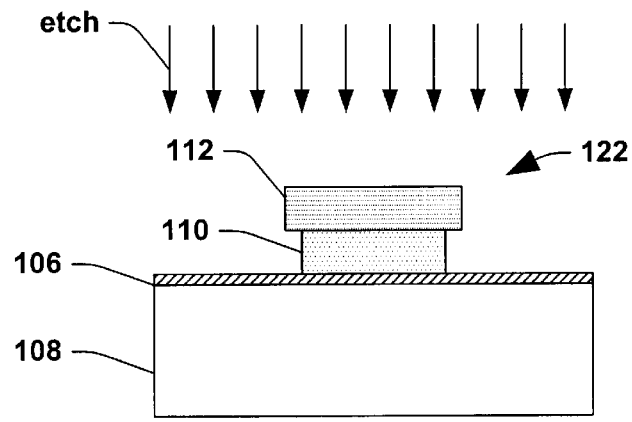
FIG. 8c is a fragmentary cross section diagram illustrating a resulting generally T-shaped silicon structure from an etch of the poly/amorphous silicon layer stack according to the present invention.

The differing etch rates of the generally amorphous silicon layer 112 and the polysilicon layer 110 during the over etch step are exploited to form a generally T-shaped silicon structure 122, as illustrated in FIG. 8c, wherein the photoresist 116 has been removed. The etch rate of polysilicon in the over etch step is substantially greater than that of amorphous silicon, for example, about twice as fast with the above exemplary OE etch chemistry. Therefore, both the amorphous silicon layer 112 and the underlying polysilicon layer 110 will experience some lateral etching at a rate which is a function of its material properties. For example, as illustrated in FIG. 8d, the lateral etch rate of the amorphous silicon ($E_{AMORPHOUS}$) is substantially less than the lateral etch rate of the polysilicon ($E_{POLY}$). Therefore the lateral extent to which the amorphous layer 112 is etched is less than that of the polysilicon layer 110. This variation causes a lateral portion 124 of the amorphous silicon layer 112 to extend beyond a lateral portion 126 of the polysilicon layer 110.

As can be seen from the above, by exploiting the differing physical properties of the poly/amorphous silicon layer stack 104, a generally T-shaped silicon structure may be formed during the etch process. Note that the resulting structure does not exhibit a transition in the materials as distinct as illustrated in FIG. 8d, which is an exaggerated illustration provided for purposes of explanation; rather the resulting structure is more gradual in the transition between the amorphous and the polysilicon. Consequently, some refer to such T-shaped structures as "mushroom structures." Nevertheless, the resulting structure does have an amorphous lateral portion 124 which extends beyond the polysilicon lateral portion.

After performing some testing, it was ascertained that for an OE step using the above exemplary OE etch chemistry, an amorphous silicon layer exhibited an etch rate of about 590 Angstroms/minute while the underlying polysilicon exhibited an etch rate of about 1240 Angstroms/minute. Thus the decreased etch rate of the amorphous layer provides for the T-shaped or mushroom structure.

According to one exemplary aspect of the present invention, a method of forming the poly/amorphous silicon layer stack 104 of step 102 is illustrated in the flow chart of FIG. 9. The step 102 is initiated by depositing a polysilicon layer over an underlying material such as a gate oxide at step 130. The resulting structure may resemble that illustrated in FIG. 10a, wherein a polysilicon layer 132 overlies the gate oxide 106 on the substrate 108. In accordance with one exemplary aspect of the present invention, the polysilicon layer is formed via a chemical vapor deposition (CVD) process in a CVD chamber having a deposition temperature of at least about 595° C. (e.g., 620° C). With such a deposition temperature, a relatively high quality polysilicon film is grown. In addition, a deposition time is controlled based on a desired polysilicon film thickness (e.g., about 1500 Angstroms).

The method step 102 of FIG. 9 continues at step 134, wherein the polysilicon layer 132 is subjected to ion implantation in order to amorphize a top portion of the layer 132, thereby converting the top portion thereof to the generally amorphous silicon layer 112, as illustrated in FIG. 10b. A bottom portion of the polysilicon layer 132 which is not amorphized by the implantation remains polysilicon (layer 110 of FIG. 8a).

According to one exemplary aspect of the present invention, a depth 136 of the generally amorphous silicon region 112 is controlled by one or more of an implantation energy, implantation dopant, and dose, as may be desired. For example, in order to amorphize approximately half of the polysilicon layer 132 (e.g., about 750 Angstroms), a germanium implant having an implantation energy of about 80 keV and a dose of about $4\times10^{15}$ ions/cm$^2$ may be employed. Alternatively, however, other dopants may be used, as well as other implantation energies and doses to customize the depth 136, and such alternatives are contemplated as falling within the scope of the present invention. In addition, the above variables may be altered to vary an amount of amorphorization of the polysilicon 132, as may be desired. In the above manner, the difference in the etch rates associated with the layers 110 and 112 may be further customized. In addition, it should be noted that if the polysilicon thickness is varied, the energy and dose of the amorphizing implantation may also vary.

In performing various experiments, the inventors of the present invention discovered that the type of dopant used to amorphize the polysilicon has an impact on the OE etch rate of the resulting generally amorphous layer. For example, some dopants such as phosphorous actually increased the OE etch rate of the amorphous layer with respect to the poly. In contrast, silicon or germanium did not enhance the OE etch rate of the amorphous layer with respect to the poly (e.g., about 1:2). Therefore to the extent that a generally amorphous layer is generated via amorphorization of polysilicon (e.g., via ion implantation), the present invention contemplates use of any dopant which advantageously results in a decrease in the OE etch rate of the amorphous layer with respect to the poly and any such dopant is contemplated as falling within the scope of the present invention.

According to yet another aspect of the present invention, the step 102 of forming the poly/amorphous silicon layer stack 104 of FIG. 7 may be accomplished in another manner, as illustrated in FIG. 11. A silicon layer is deposited (e.g., via CVD) at a first deposition temperature (e.g., at least about 595° C.) at step 140, wherein the first deposition temperature results in the deposited silicon being a polysilicon material (layer 110), as illustrated in FIG. 12a. In addition, a deposition duration may be controlled to customize the thickness of the polysilicon layer 110.

After the first duration period has elapsed, a second silicon deposition occurs at step 142, wherein silicon is deposited (e.g., via CVD) at a second deposition temperature (e.g., less than about 595° C.) for another predetermined time period. The second deposition temperature results in the deposited silicon being a generally amorphous silicon material (layer 112), wherein a thickness thereof is a function of the deposition duration, as illustrated in FIG. 12b.

In accordance with one exemplary aspect of the present invention, the two step deposition process may occur within a single CVD chamber such that the wafer is not exposed to ambient conditions between steps, thereby reducing chances of contamination associated with moving a substrate between multiple pieces of equipment. In addition, it has been found that by altering the deposition temperatures, differing grades of polysilicon and amorphous silicon may be fabricated, thereby providing another degree of freedom by which the structure may be customized and controlled. For example, at deposition temperatures of about 620° C. or more, relatively high quality polysilicon films are generated with known etch rates associated therewith, while at deposition temperatures less than about 550° C., substantially amorphous silicon films are formed with known etch rates associated therewith. Furthermore, for deposition temperatures between about 550° C. and about 595° C., partially amorphous silicon films are formed with etch rates that fall between purely polysilicon and amorphous films.

Therefore according to the present invention, an aspect ratio associated with the generally T-shaped silicon structure may be customized in a variety of well controlled ways. An exemplary aspect ratio of a generally T-shaped silicon structure is illustrated in FIG. 13. A lateral extent to which the top portion 112 extends beyond the bottom portion 110 can be characterized by a distance "X" as illustrated. In addition, the total height of the silicon structure may be characterized as "$Y_T$" while a ratio of the thickness of the layers 110 and 112 may be characterized as "$Y_2/Y_1$", wherein a large ratio indicates a thick amorphous layer relative to the poly layer, and a small ratio indicates a thin amorphous layer relative to the poly layer. By controlling various parameters in the formation of the poly/amorphous silicon layer stack and the quality of the various layers making up the stack, a plethora of generally T-shaped silicon structures having differing aspect ratios advantageously may be generated in an easy and controllable manner.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming a T-shaped structure, comprising the steps of:
   forming a poly/amorphous silicon layer stack, wherein the poly/amorphous silicon layer stack comprises a polysilicon layer and a generally amorphous silicon layer overlying the polysilicon layer; and
   selectively etching the poly/amorphous silicon layer stack, wherein an etch rate associated with the generally amorphous silicon layer in an over etch step associated therewith is less than an etch rate associated with the polysilicon layer, thereby causing a lateral portion of the generally amorphous silicon layer to extend beyond a corresponding lateral portion of the polysilicon layer.

2. The method of claim 1, wherein forming the poly/amorphous silicon layer stack comprises:
   forming a polysilicon layer; and
   forming a generally amorphous silicon layer over the polysilicon layer.

3. The method of claim 2, wherein forming the poly/amorphous silicon layer stack comprises:
   depositing silicon using a chemical vapor deposition process operating in a first temperature range to form the polysilicon layer; and
   depositing silicon using a chemical vapor deposition process operating in a second temperature range to form the generally amorphous silicon layer.

4. The method of claim 3, wherein the first temperature range comprises temperatures greater than about 595° C.

5. The method of claim 4, wherein the second temperature range comprises temperatures less than about 595° C.

6. The method of claim 5, wherein the second temperature range comprises temperatures less than about 550° C.

7. The method of claim 2, wherein forming the poly/amorphous silicon layer stack comprises:
   depositing, for a predetermined period of time, silicon in a chemical vapor deposition chamber operating at a first deposition temperature; and
   depositing, for another predetermined period of time, silicon in the chemical vapor deposition chamber operating at a second deposition chamber, wherein the first and second deposition temperatures are different.

8. The method of claim 7, wherein the first deposition chamber temperature is greater than the second deposition chamber temperature.

9. The method of claim 1, wherein forming the poly/amorphous silicon layer stack comprises:
   forming a polysilicon layer; and
   implanting a top portion of the polysilicon layer with a dopant, wherein the implanting causes the top portion of the polysilicon layer to become generally amorphous silicon, and a bottom portion of the polysilicon layer to remain polysilicon.

10. The method of claim 9, wherein a thickness of the top portion generally amorphous silicon layer is a function of an implantation energy.

11. The method of claim 9, wherein a ratio of a top portion thickness to a bottom portion thickness impacts a distance by which the lateral portion of the generally amorphous silicon layer extends beyond the lateral portion of the polysilicon region.

12. The method of claim 9, wherein implanting the top portion of the polysilicon layer comprises implanting the dopant at an energy of about 80 keV at a dose of about $4 \times 10^{15}$ ions/cm$^2$.

13. The method of claim 9, wherein implanting the top portion of the polysilicon layer with a dopant comprises employing a dopant which results in an etch rate of the resulting generally amorphous silicon associated with the over etch step which is less than the etch rate of the underlying polysilicon.

14. The method of claim 13, wherein the dopant comprises silicon or germanium.

15. A method of forming a transistor having a generally T-shaped gate electrode, comprising the steps of:
   forming a gate oxide over a semiconductor substrate;
   forming a poly/amorphous silicon layer stack over the gate oxide, wherein the poly/amorphous silicon layer stack comprises a polysilicon layer and a generally amorphous silicon layer lying thereover;
   selectively etching the poly/amorphous silicon layer stack, wherein an etch rate associated with the generally amorphous silicon layer in an over etch step associated therewith is less than an etch rate associated with the underlying polysilicon layer, thereby causing lateral portions of the generally amorphous silicon layer to extend beyond lateral portions of the polysilicon layer, thereby defining a generally T-shaped gate electrode; and forming a source region and a drain region in the semiconductor substrate.

16. The method of claim 15, wherein forming the source region and the drain region comprise:

implanting the semiconductor substrate with a dopant, thereby defining a first doped region and a second doped region having a distance therebetween, wherein the distance corresponds to a width of the etched generally amorphous silicon layer; and subjecting the doped semiconductor substrate to thermal processing, thereby causing the first doped region which forms the source region and the second doped region which forms the drain region to diffuse, thereby reducing the distance therebetween under the generally T-shaped gate electrode.

17. The method of claim 16, wherein the source region and the drain region contribute to a gate-to-source capacitance and a gate-to-drain capacitance respectively, wherein the capacitances are a function of an amount by which the source region and the drain region underlies portions of the etched polysilicon layer portion of the generally T-shaped electrode, respectively.

18. The method of claim 15, wherein forming the poly/amorphous silicon layer stack comprises:

forming a polysilicon layer; and forming a generally amorphous silicon layer over the polysilicon layer.

19. The method of claim 18, wherein forming the poly/amorphous silicon layer stack comprises:

depositing silicon using a chemical vapor deposition process operating in a first temperature range to form the polysilicon layer; and depositing silicon using a chemical vapor deposition process operating in a second temperature range to form the generally amorphous silicon layer.

20. The method of claim 19, wherein the first temperature range comprises temperatures greater than about 595° C.

21. The method of claim 20, wherein the second temperature range comprises temperatures less than about 595° C.

22. The method of claim 21, wherein the second temperature range comprises temperatures less than about 550° C.

23. The method of claim 19, wherein forming the poly/amorphous silicon layer stack comprises:

depositing, for a predetermined period of time, silicon in a chemical vapor deposition chamber operating at a first deposition temperature; and depositing, for another predetermined period of time, silicon in the chemical vapor deposition chamber operating at a second deposition chamber, wherein the first and second deposition temperatures are different.

24. The method of claim 23, wherein the first deposition chamber temperature is greater than the second deposition chamber temperature.

25. The method of claim 15, wherein forming the poly/amorphous silicon layer stack comprises:

forming a polysilicon layer; and implanting a top portion of the polysilicon layer with a dopant, wherein the implanting causes the top portion of the polysilicon layer to become generally amorphous silicon, and a bottom portion of the polysilicon layer to remain polysilicon.

26. The method of claim 25, wherein a thickness of the top portion generally amorphous silicon layer is a function of an implantation energy.

27. The method of claim 25, wherein a ratio of a top portion thickness to a bottom portion thickness impacts a distance by which the lateral portion of the generally amorphous silicon layer extends beyond the lateral portion of the polysilicon region.

28. The method of claim 25, wherein implanting the top portion of the polysilicon layer comprises implanting the dopant at an energy of about 80 keV at a dose of about $4 \times 10^{15}$ ions/cm$^2$.

* * * * *